(12) United States Patent
Yun

(10) Patent No.: US 8,828,864 B2
(45) Date of Patent: Sep. 9, 2014

(54) SEMICONDUCTOR DEVICE AND METHOD FOR MANUFACTURING THE SAME

(75) Inventor: Hyeong Uk Yun, Gyeonggi-do (KR)

(73) Assignee: Hynix Semiconductor Inc., Icheon (KR)

(*) Notice: Subject to any disclaimer, the term of this patent is extended or adjusted under 35 U.S.C. 154(b) by 196 days.

(21) Appl. No.: 13/279,088

(22) Filed: Oct. 21, 2011

(65) Prior Publication Data
US 2012/0146237 A1 Jun. 14, 2012

(51) Int. Cl.
*H01L 21/4763* (2006.01)
*H01L 49/02* (2006.01)
*H01L 27/108* (2006.01)

(52) U.S. Cl.
CPC .......... *H04L 27/10852* (2013.01); *H01L 28/91* (2013.01); *H01L 28/87* (2013.01); *H01L 27/10817* (2013.01)
USPC .......................................... 438/629; 438/387

(58) Field of Classification Search
CPC .............. H01L 28/91; H01L 27/10817; H01L 27/10855
USPC .................................................. 438/629, 387
See application file for complete search history.

(56) References Cited

U.S. PATENT DOCUMENTS

| | | | |
|---|---|---|---|
| 2008/0157279 A1* | 7/2008 | Horikawa | 257/534 |
| 2009/0032905 A1* | 2/2009 | Yeo et al. | 257/532 |
| 2010/0187655 A1* | 7/2010 | Choi et al. | 257/532 |

FOREIGN PATENT DOCUMENTS

| | | |
|---|---|---|
| KR | 1020060001115 A | 1/2006 |
| KR | 1020080014201 A | 2/2008 |
| KR | 1020090044525 A | 5/2009 |

* cited by examiner

*Primary Examiner* — Douglas Menz

(57) ABSTRACT

A semiconductor device and a method for manufacturing the same are disclosed. When forming a profile of the lower electrode, a second lower electrode hole (i.e., a bunker region) located at the lowermost part of the lower electrode is buried with an Ultra Low Temperature Oxide (ULTO) material without damaging the lower electrode material. As a result, when a dielectric film is deposited in a subsequent process, the above-mentioned semiconductor device prevents the occurrence of a capacitor leakage current caused by defective gap-filling of the dielectric film located at the lowermost part of the lower electrode.

17 Claims, 5 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0127903 filed on 24 Sep. 2010, the disclosure of which is hereby incorporated in its entirety by reference, is claimed.

BACKGROUND OF THE INVENTION

Embodiments of the present invention relate to a semiconductor device and a method for manufacturing the same.

In case of a semiconductor device such as a Dynamic Random Access Memory (DRAM), it is necessary to reduce the area occupied by the semiconductor device in proportion to the increasing degree of integration, and electrostatic capacitance needs to be maintained or increased. Generally, there are a variety of methods to guarantee sufficient cell electrostatic capacitance within a limited area, for example, a method for using a high dielectric material as a dielectric film, a method for reducing a thickness of the dielectric film, a method for increasing an effective region of a lower electrode, etc. Specifically, the method for using the high dielectric material requires time and material investment, for example, the introduction of new equipment or installations, the necessity of verifying the reliability and productivity of a dielectric film, low-temperature processing of a subsequent process, etc. Accordingly, the method for increasing the effective region has an advantage in that a conventional dielectric film can continue to be used and the implementation of a fabrication process becomes relatively easier, so that it can be widely used in the actual fabrication process due to the above-mentioned advantages.

There are a variety of methods to increase an effective region of the lower electrode, for example, a method for configuring a lower electrode in the form of a three-dimensional (3D) structure (such as a cylinder or a fin), a method for growing a Hemispherical Grain (HSG) on a lower electrode, a method for increasing the height of a lower electrode, etc. Specifically, the method for growing the HSG may cause unexpected problems in guaranteeing a Critical Dimension (CD) of at least a predetermined level between lower electrodes, and may cause a bridge between lower electrodes due to infrequent HSG desquamation, so that it is difficult for the aforementioned HSG growing method to be applied to a semiconductor device based on the design rule of 0.14 µm or less. Therefore, in general, in order to increase cell electrostatic capacitance, a variety of methods for configuring a lower electrode in the form of a 3D structure and increasing the height of the lower electrode have been widely used. A representative example of such methods is a method for forming a cylindrical lower electrode or a stack-shaped lower electrode.

Specifically, the conventional method for forming the cylindrical lower electrode necessarily includes removing a sacrificial insulation film from a peripheral part of the lower electrode, and depositing a dielectric film over the lower electrode. In this case, the dielectric material contained in the dielectric film is not deposited only over the lower electrode but is deposited between neighboring lower electrodes, such that all the cells can share a dielectric material and an upper electrode formed over the dielectric material. Provided that the cells share and use such a dielectric material, capacitance (storage capacitance) among all the lower electrodes may be interfered or distorted.

As described above, in order to maximize cell capacitance for improving refresh characteristics of the conventional cylindrical lower electrode, the height of each lower electrode becomes increased and the spacing between the lower electrode contact plugs becomes smaller. As a result, there arises a bridge between lower electrodes, and it is difficult to guarantee a contact region between the lower electrode contact plug and the lower electrode.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device and a method for manufacturing the same, in which, when forming a profile of a lower electrode, a second lower electrode hole (i.e., a bunker region) located at the lowermost part of the lower electrode is buried with an Ultra Low Temp Oxide (ULTO) material without damaging the lower electrode material, consequently when a dielectric film is deposited in a subsequent process, the above-mentioned semiconductor device prevents the occurrence of a capacitor leakage current caused by defective gap filling of the dielectric film located at the lowermost part of the lower electrode.

In accordance with an aspect of the present invention, a method for manufacturing a semiconductor device includes forming a contact plug over a semiconductor substrate; forming a lower electrode coupled to the contact plug; forming an insulation film pattern in the lower electrode; and forming a dielectric film over the lower electrode and the insulation film pattern.

The forming of the contact plug further may include forming an interlayer insulation film over the semiconductor substrate; forming a contact hole by etching the interlayer insulation film; and burying a conductive layer in the contact hole.

The forming of the insulation film in the lower electrode may further include forming the insulation film pattern over the contact plug and the interlayer insulation film.

The method may further include, after the formation of the contact plug, forming an etch stop layer.

The forming of the lower electrode may include forming an etch stop layer and a sacrificial insulation film over an entire surface including the contact plug; after forming a photoresist film over the sacrificial insulation film, forming a photoresist pattern using an exposure and development process of using a lower electrode mask; forming a first lower electrode hole by etching the sacrificial insulation film and the etch stop layer using the photoresist pattern as an etch mask until the contact plug is exposed; forming a conductive film over the first lower electrode hole; and planarize-etching the conductive layer until the sacrificial insulation film is exposed.

The forming of the first lower electrode hole may further include forming a second lower electrode hole by additionally etching a contact plug contacting the first lower electrode hole.

The conductive layer may be formed in a laminated structure of a titanium (Ti) film and a titanium nitride (TiN) film.

The method may further include, after the formation of the lower electrode hole, performing a Post Etch Treatment (PET) process.

The sacrificial insulation film may be formed in a laminated structure of Tetraethyl Orthosilicate (TEOS) film and Phosphosilicate Glass (PSG) film.

The method may further include, after the planarize-etching of the conductive layer, removing the sacrificial insulation film using a dip-out process.

The insulation film pattern may be an Ultra Low Temp Oxide (ULTO) film and includes $SiO_2$.

The ULTO film may use a Hexachlorodisilane (HCD) material as source gas and is formed at a temperature of 90° C.~110° C.

The method may further include, after the formation of the insulation film pattern, reducing a thickness of the insulation film pattern using a hydro-fluoric (HF)-based wet dip-out process.

The insulation film pattern may be formed to have a thickness of 300 Å~700 Å.

The insulation film pattern may be formed using an Atomic Layer Deposition (ALD) process.

In accordance with another aspect of the present invention, a semiconductor device includes a contact plug formed over a semiconductor substrate; a lower electrode coupled to the contact plug; an insulation film pattern formed in the lower electrode; and a dielectric film formed over the lower electrode and the insulation film.

The insulation film pattern may be an Ultra Low Temp Oxide (ULTO) film and includes $SiO_2$.

The ULTO film may use a Hexachlorodisilane (HCD) material as source gas and is formed at a temperature of 90° C.~110° C.

The insulation film pattern may be formed to have a thickness of 300 Å~700 Å.

The insulation film pattern may be formed using an Atomic Layer Deposition (ALD) process.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the appended drawings.

Figure 1:
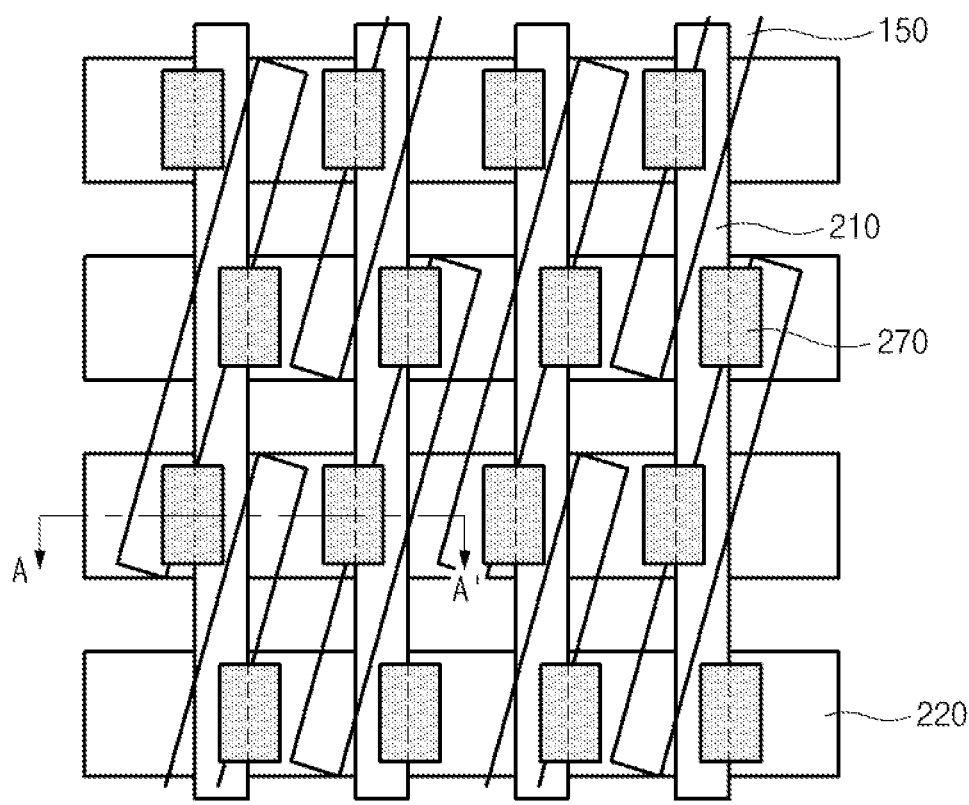
FIG. 1 is a plan view illustrating a semiconductor device and a method for manufacturing the same according to an embodiment of the present invention.

FIG. 1 is a plan view illustrating a semiconductor device and a method for manufacturing the same according to an embodiment of the present invention.

Referring to FIG. 1, the semiconductor device includes an active region 150, a bit line pattern 210, a storage node contact plug 220, and a lower electrode 270. In more detail, a 6F2-shaped active region 150 is formed, and the bit line pattern 210 is formed diagonal to the active region 150.

In addition, the active region 150 is divided into three equal parts so that storage node contact plugs 220 are formed. A lower electrode 270 is formed over the storage node contact plug 220. In this case, due to a bunker (i.e., a second lower electrode hole disposed in a sidewall) generated when forming the lower electrode 270, defective gapfilling of the lowermost part of the lower electrode 270 or defective leakage of the lower electrode 270 can be prevented according to the embodiment of the present invention. In other words, an Ultra Low Temperature Oxide (ULTO) material is buried in the bunker so that it can prevent a leakage current from being generated in a capacitor.

FIGS. 2A to 2G are cross-sectional views taken along A-A' of FIG. 1 illustrating a semiconductor device and a method for manufacturing the same according to embodiments of the present invention.

Figure 2A:
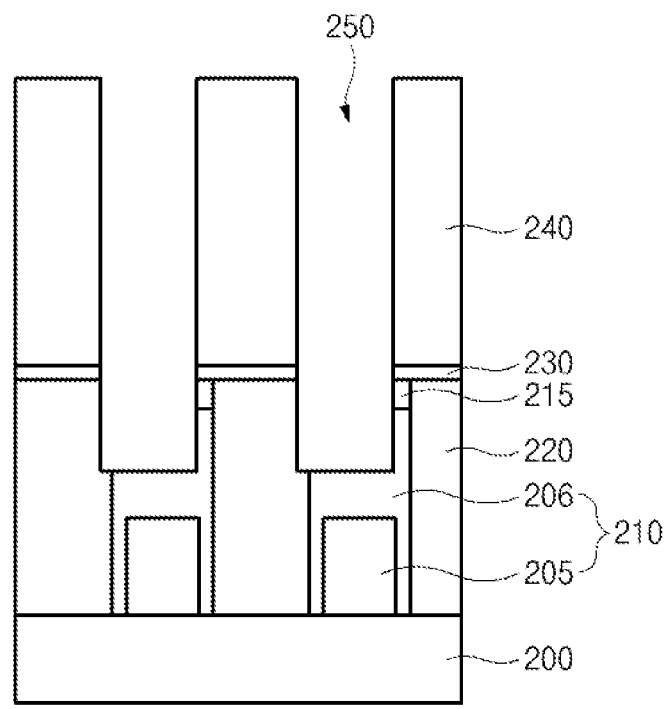
FIGS. 2A to 2G are cross-sectional views illustrating a semiconductor device and a method for manufacturing the same according to embodiments of the present invention.

Referring to FIG. 2A, a device isolation region defining an active region is formed over a semiconductor substrate 200.

Subsequently, a bit line pattern 210 is formed over the semiconductor substrate 200. In an embodiment, the bit line pattern 210 may be formed in a laminated structure of a bit line metal layer 205 and a bit line capping film 206. The bit line capping film 206 may be formed of a nitride film.

In addition, after an interlayer insulation film 215 is formed over the bit line pattern 210 and the semiconductor substrate, the interlayer insulation film 215 may be planarized and etched using a Chemical Mechanical Polishing (CMP) method until the bit line pattern 210 is exposed. In this case, the interlayer insulation film 215 may include an oxide film.

Subsequently, after a photoresist film is formed over the interlayer insulation film 215 and the bit line pattern 210, an exposure and development process is performed using a mask for forming a storage node contact plug so that a photoresist pattern (not shown) is formed. The interlayer insulation film 215 is etched using the photoresist pattern as an etch mask, so that a storage node contact hole (not shown) is formed. Subsequently, a conductive material is buried in the storage node contact hole so that a storage node contact plug 220 is formed. In this case, the conductive material may be impurity-implanted polysilicon, and the impurity may be $PH_3$ and have a density of 0.5 $E/cm^2$~2 $E/cm^2$.

After that, an etch stop layer 230 is formed over the storage node contact plug 220. In this case, the etch stop layer may include a nitride film. In addition, a sacrificial insulation film 240 is formed over the etch stop layer 230. In this case, the sacrificial insulation film 240 may be formed in a laminated structure of a Tetraethyl Orthosilicate (TEOS) film and Phosphosilicate Glass (PSG) film.

Subsequently, after a photoresist film is formed over the sacrificial insulation film 240, a photoresist pattern (not shown) is formed using an exposure and development process using a lower electrode mask. The sacrificial insulation film 240 and the etch stop layer 230 are etched using the photoresist pattern as an etch mask until the storage node contact plug 220 is exposed, so that a first lower electrode hole 250 is formed.

Figure 2B:
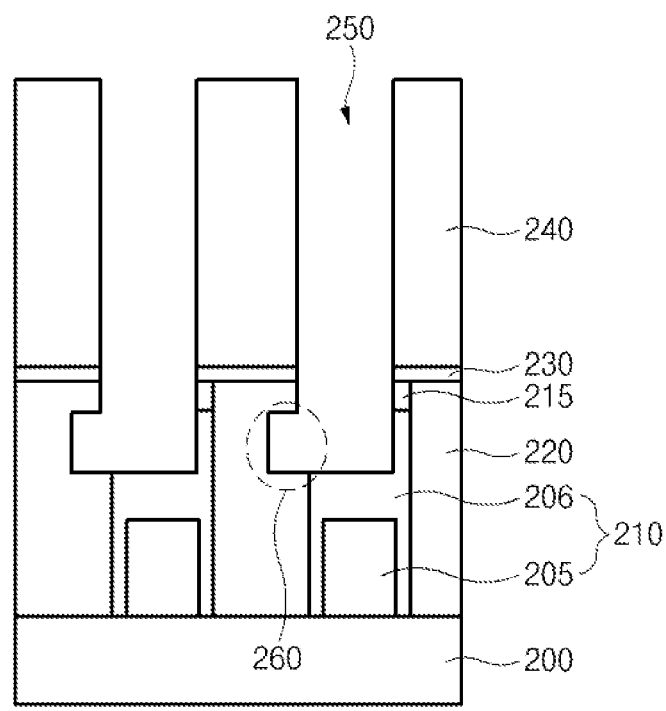

Referring to FIG. 2B, after the first lower electrode hole 250 is formed, a Post Etch Treatment (PET) process is performed. In this case, if the PET process is performed, a second lower electrode hole 260 may be formed in the exposed storage node contact plug. The second lower electrode hole 260 may be disposed orthogonal to the direction of first electrode hole 250, so that the second electrode hole 260 is formed in a sidewall of a storage node contact plug 220.

Figure 2C:
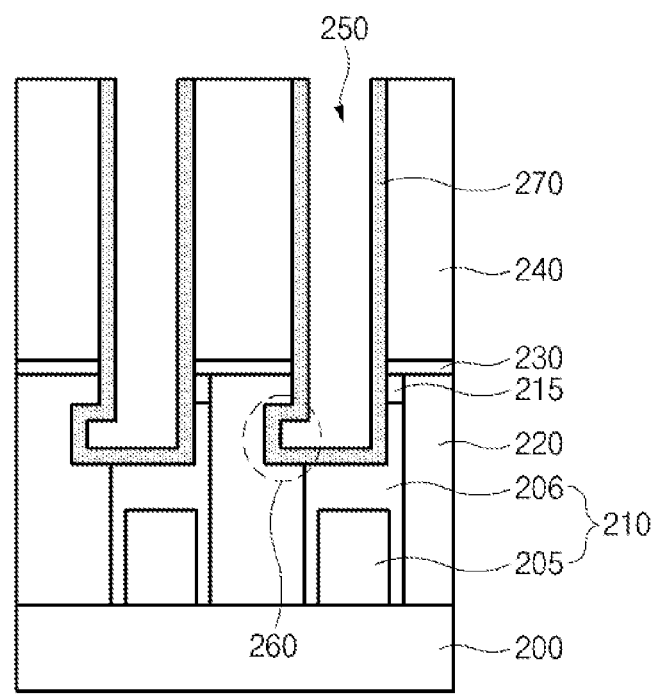

Referring to FIG. 2C, after a conductive layer (not shown) is formed over the sacrificial insulation film 240 contained in the second and first lower electrode holes 260 and 250, the storage node contact plug 220, and the bit line capping film 206, the conductive layer is etched back so that a lower electrode 270 separated between cells is formed. In this case, the conductive layer may be formed in a laminated structure of a titanium (Ti) film and a titanium nitride (TiN) film, and the lower electrode 270 may be formed using a Chemical Vapor Deposition (CVD) method.

Figure 2D:
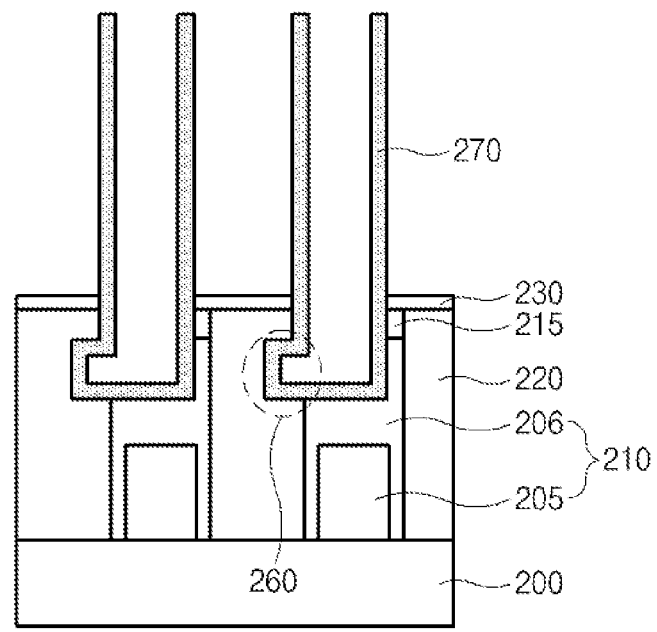

Referring to FIG. 2D, the sacrificial insulation film 240 is removed by a dip-out process.

Figure 2E:
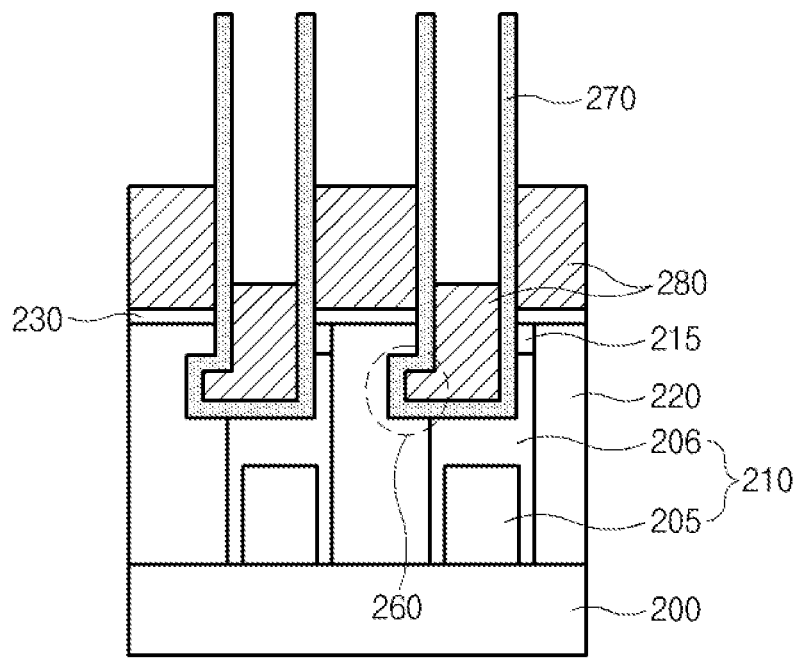
Figure 2F:
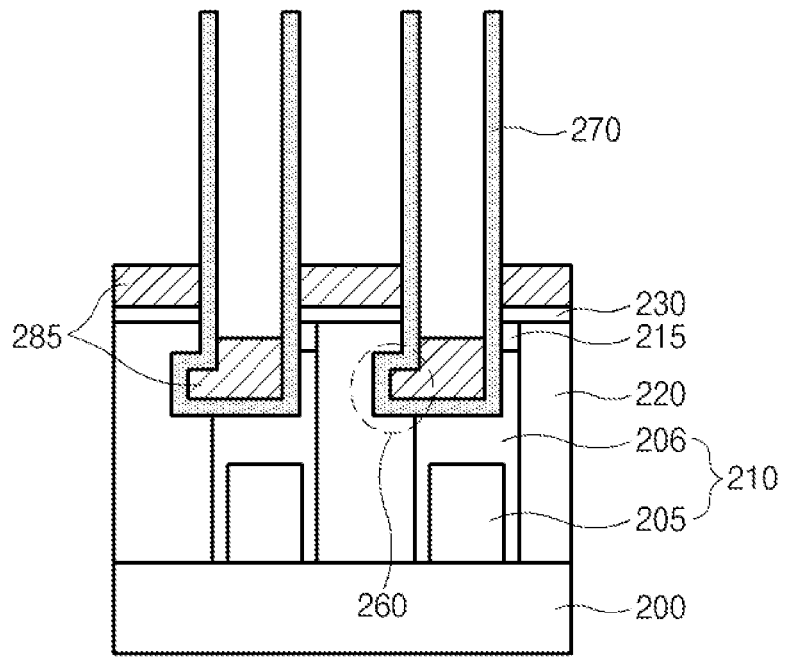

Referring to FIG. 2E and FIG. 2F, after an Ultra Low Temp Oxide (ULTO) film is formed over the lower electrode 270 and the etch stop layer 230, a hydro-fluoric (HF)-based wet dip-out process is performed to reduce a thickness of the ULTO film 280, so that the ULTO film pattern 285 is formed. In this case, the ULTO film 280 may include an $SiO_2$ film and may have a thickness of 300 Å~700 Å. In this case, the ULTO film 280 may be deposited using an Atomic Layer Deposition (ALD) scheme. Since the ALD deposition scheme does not use plasma, it can prevent damage of the lower electrode 270. In addition, the ULTO film 280 may use a Hexachlorodisilane (HCD) material as source gas, and may be formed at a temperature of 90° C.~110° C. That is, the ULTO film 280 has superior gapfilling characteristics because of superior step coverage, has no loading effects, and has superior uniformity. In addition, the ULTO film 280 includes almost no impurities such as carbon (C) or chlorine (Cl) and does not include impurities such as metal, so that it may not affect characteristics of the conductive material (TiN) of the lower electrode.

Figure 2G:
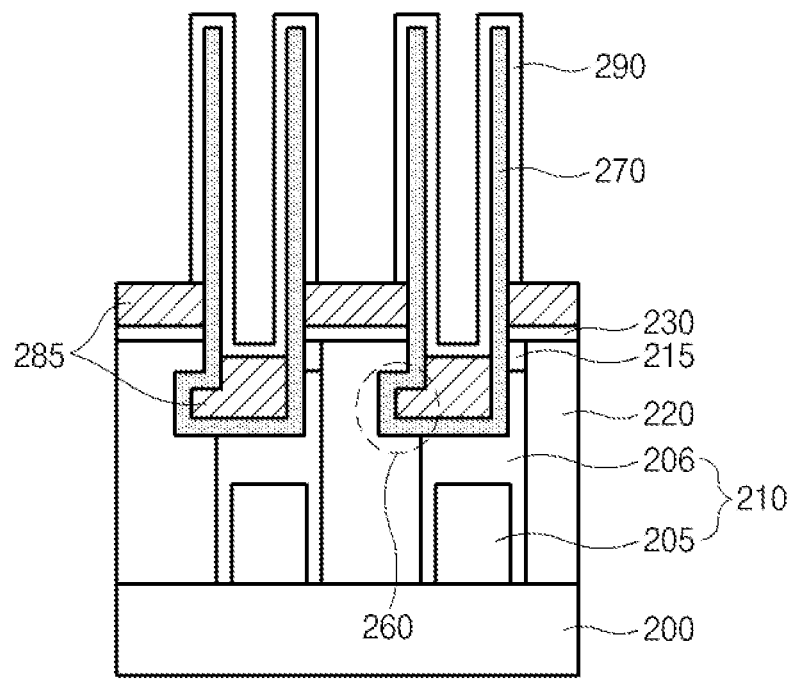

Referring to FIG. 2G, a dielectric film 290 is formed over the lower electrode 270. In this case, the dielectric film 290 may be deposited in the order of $ZrO_2 \rightarrow Al_2O_3 \rightarrow ZrO_2$, and may also be formed using an ex-situ or in-situ process. In case of using $ZrO_2$, TEMAZ (tetrakis-ethyl-methyl-amino-zirconium) and $O_3$ serving as main source gas may be added. In case of using $Al_2O_3$, TMA (trimethyl aluminum) and $O_3$ may be added. In this case, since the ULTO film 280 is gap-filled in the lowermost part of the lower electrode 270, the dielectric film 290 is not deposited over the second lower electrode hole 260 located at the lowermost part of the lower electrode 270 so that it can prevent a defective leakage current from being locally generated in the lower electrode 270.

As is apparent from the above description, in case of a semiconductor device and a method for manufacturing the same according to the above-mentioned embodiments of the present invention, when forming a profile of the lower electrode, a second lower electrode hole (i.e., a bunker region) located at the lowermost part of the lower electrode is buried with an Ultra Low Temperature Oxide (ULTO) material without damaging the lower electrode material. As a result, when a dielectric film is deposited in a subsequent process, the above-mentioned semiconductor device can prevent the occurrence of a capacitor leakage current caused by defective gapfilling of the dielectric film located at the lowermost part of the lower electrode.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device comprising:
    forming a contact plug over a semiconductor substrate;
    forming a sacrificial insulation film over an upper surface of the semiconductor including the contact plug;
    forming a first lower electrode hole by etching the sacrificial insulation film until the contact plug is exposed;
    etching a sidewall of the contact plug to form a second lower electrode disposed at a lower surface of the first lower electrode hole;
    forming a conductive film over the first lower electrode hole and the second lower electrode hole to form a lower electrode coupled to the contact plug;
    forming an insulation film pattern to fill a bottom portion of the lower electrode including the second contact hole such that upper sidewalls of the lower electrode are exposed, wherein forming an insulation film pattern includes depositing an insulation film over the lower electrode to fill the second lower electrode hole; and
    forming a dielectric film over the lower electrode and the insulation film pattern.

2. The method according to claim 1, wherein the forming of the contact plug further includes:
    forming an interlayer insulation film over the semiconductor substrate;
    forming a contact hole by etching the interlayer insulation film; and
    burying a conductive layer in the contact hole.

3. The method according to claim 2, wherein the forming of the insulation film pattern in the lower electrode further includes:
    forming the insulation film pattern over the contact plug and the interlayer insulation film.

4. The method according to claim 1, further comprising:
    after the formation of the contact plug, forming an etch stop layer.

5. The method according to claim 1, further comprising:
    forming an etch stop layer and the sacrificial insulation film over an upper surface of the semiconductor including the contact plug;
    after forming a photoresist film over the sacrificial insulation film, forming a photoresist pattern;
    forming a first lower electrode hole by etching the sacrificial insulation film and the etch stop layer using the photoresist pattern as an etch mask until the contact plug is exposed;
    forming a conductive film over the first lower electrode hole; and
    removing portions of the conductive layer until the sacrificial insulation film is exposed.

6. The method according to claim 1, wherein the conductive layer comprises a laminated structure of a titanium (Ti) film and a titanium nitride (TiN) film.

7. The method according to claim 1, further comprising:
    after forming the first lower electrode hole, performing a Post Etch Treatment (PET) process.

8. The method according to claim 1, wherein the sacrificial insulation film is formed in a laminated structure of Tetraethyl Orthosilicate (TEOS) film and Phosposilicate Glass (PSG) film.

9. The method according to claim 5, further comprising:
    after the removing portions of the conductive layer, removing the sacrificial insulation film using a dip-out process.

10. The method according to claim 1, wherein the insulation film pattern is an Ultra Low Temperature Oxide (ULTO) film and includes $SiO_2$.

11. The method according to claim 10, wherein the ULTO film uses a Hexachlorodisilane (HCD) material as source gas and is formed at a temperature of 90° C.~110° C.

12. The method according to claim 1, wherein the insulation film pattern is formed using an Atomic Layer Deposition (ALD) process.

13. The method according to claim 1, further comprising:
   after the formation of the insulation film pattern, reducing a thickness of the insulation film pattern using a hydrofluoric (HF)-based wet dip-out process.

14. The method according to claim 1, wherein the insulation film pattern is formed to have a thickness of 300 Å~700 Å.

15. The method according to claim 1, wherein forming the insulation film pattern comprises etching an upper surface of the insulation film pattern until the upper surface is below an upper surface of the contact plug.

16. The method of claim 1, wherein forming the insulation film pattern comprises depositing the insulation film pattern on an upper surface of the semiconductor device to form an interlayer insulation layer.

17. The method of claim 1, wherein forming the insulation film pattern comprises forming the insulation film pattern in spaces between neighboring lower electrodes.

* * * * *